United States Patent [19]

Beck et al.

[11] Patent Number: 5,442,090
[45] Date of Patent: Aug. 15, 1995

[54] RADIATION-CURABLE URETHANE ACRYLATE COMPOUNDS CONTAINING AMINE AND UREA GROUPS

[75] Inventors: Erich Beck, Harthausen; Wolfram Weiss, Mutterstadt; Hans Renz, Meckenheim; Alfred Lindner, Bobenheim-Roxheim, all of Germany

[73] Assignee: BASF Aktiengesellschaft, Ludwigshafen, Germany

[21] Appl. No.: 663,966

[22] Filed: Mar. 4, 1991

[30] Foreign Application Priority Data

Mar. 7, 1990 [DE] Germany .................. 40 07 146.4

[51] Int. Cl.⁶ .................. C07C 271/28; C07C 271/16; C07C 269/02
[52] U.S. Cl. ........................ 560/25; 560/158
[58] Field of Search ................... 560/25, 158

[56] References Cited

U.S. PATENT DOCUMENTS 3,864,133  2/1975  Hisamatsu et al. ............. 96/115 P
4,605,723  8/1986  Flakus ............................ 528/49

FOREIGN PATENT DOCUMENTS 0167731  4/1985  European Pat. Off. .
2140306  6/1978  Germany .

*Primary Examiner*—José G. Dees
*Assistant Examiner*—B. Frazier
*Attorney, Agent, or Firm*—Keil & Weinkauf

[57] ABSTRACT

Radiation-curable urethane acrylate compounds containing amine and urea groups and based on di- or polyisocyanates, hydroxy compounds and amines contain secondary or tertiary amino groups which are bonded to isocyanate via hydroxyl groups and are obtainable by an addition reaction of primary or secondary amines with hydroxyacrylates.

6 Claims, No Drawings

RADIATION-CURABLE URETHANE ACRYLATE COMPOUNDS CONTAINING AMINE AND UREA GROUPS

The present invention relates to radiation-curable urethane acrylate compounds containing amine and urea groups and based on di- or polyisocyanates, hydroxy compounds and amines, which contain secondary or tertiary amino groups which are bonded to isocyanate via hydroxyl groups and are obtainable by an addition reaction of primary or secondary amines with hydroxyacrylates.

Urethane acrylate compounds are used, if necessary in combination with further radiation-curable components, as materials and coatings which can be cured in the presence of a photoinitiator system by means of high energy radiation.

DE-A-31 06 367 discloses ethylenically unsaturated oligourethane compounds which are obtained by reacting di- or polyisocyanates with polyols, ethylenically unsaturated hydroxy compounds, these being methacrylates, and N,N'-substituted aliphatic amines. The addition of amine ensures rapid reaction of the remaining terminal isocyanate groups to give terminal urea groups, in order to obtain products having a long shelf life. Under the chosen conditions, excess amine is present as free, unbound component and migrates causing exudation and emissions in the uncured or cured product and has a plasticizer effect in the cured product.

EP-B-16 77 731 describes the degradation of residual isocyanate in urethane acrylates which are prepared from isophorone diisocyanate or its isocyanurate, hydroxyalkyl acrylates and polyhydroxy compounds by the addition of primary or secondary divines. Diamines lead to chain extension and, in the case of excess divine, based on the isocyanate groups, to crosslinked products.

DE-B-21 40 306 describes photopolymerizable mixtures which contain a polyurethane. A short curing time is achieved in the presence of atmospheric oxygen by means of amine compounds which may be both present in free, dissolved form and bonded to isocyanate groups. In the synthesis of the amine-modified polyurethanes, primary or secondary amines and tertiary hydroxyl-containing amines are used, an excess of these amines, based on the residual isocyanate groups, being carefully avoided, ie. it is necessary to ensure exact molar equivalence.

In general, the prior art indicates a desire for very reactive urethane acrylate compounds which can be prepared in a simple manner. Emissions of freely migratable hydroxy compounds or amines when the urethane acrylate compounds are used as coating materials or molding materials should not occur.

It is an object of the present invention to provide radiation-curable urethane acrylate compounds having high reactivity, and a process for their preparation.

We have found that this object is achieved by the radiation-curable urethane acrylate compounds containing amine and urea groups, as claimed in claim 1. We have furthermore found a process for the preparation of the novel urethane acrylate compounds.

The novel urethane acrylate compounds surprisingly have a generally advantageous property spectrum, in particular with regard to reactivity and content of freely migratable compounds.

The novel process for the preparation of the urethane acrylate compounds leads to urethane acrylate compounds which are substantially free of free isocyanate groups and unbonded hydroxyalkyl acrylates or amines. Undesirable emissions of toxic amines or hydroxyalkyl acrylates can therefore substantially be avoided.

Suitable di- or polyisocyanate compounds from which the novel urethane acrylate compounds are derived are compounds which contain two or more isocyanate groups capable of reacting with alcohols or primary and secondary amines. In addition to aliphatic, cycloaliphatic and aromatic disocyanates, these are also polyisocyanates, for example isocyanurates, polyisocyanates which contain biuret groups and polyisocyanates as formed in the reaction of trihydric or polyhydric alcohols with diisocyanates.

Isophorone diisocyanate, hexamethylene diisocyanate, trimethylhexamethylene diisocyanates, toluylene diisocyanates, diphenylmethane diisocyanates, dicyclohexylene 4,4'-diisocyanates and xylylene diisocyanates are preferred.

Reaction products of trihydric or polyhydric alcohols with one or more diisocyanate compounds in a ratio of the number of OH equivalents to that of NCO from 1:1.5 to 1:3, preferably from 1:1.5 to 1:2.5 or isocyanurates are particularly preferred polyisocyanates.

The isocyanurate of hexamethylenediamine is very particularly preferred.

The novel urethane acrylate compounds contain hydroxy compounds which are bonded via the isocyanate groups.

Not less than 20, in particular not less than 50, particularly preferably not less than 70, mol % of the hydroxyl compounds are hydroxyacrylates.

Examples of suitable hydroxyacrylates are mono-, di- or triacrylates, as formed, for example, by reacting acrylic acid with monohydric or polyhydric alcohols or alkoxylated derivatives thereof and by reacting acrylic acid with mono- or diepoxy compounds.

Hydroxyacrylates of the formula

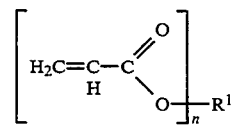

where $R^1$ is $C_2$–$C_8$-alkyl which is substituted by one or two hydroxyl groups and n is 1, 2 or 3, for example 2-hydroxyethyl acrylate, 3-hydroxypropyl acrylate, butanediol monoacrylate, trimethylolpropane monoacrylate, trimethylolpropane diacrylate and pentaerythritol triacrylate or mixtures thereof, are preferred.

Phenyl glycidyl ether acrylate, cresyl glycidyl ether acrylate, glycidyl versatate acrylate, butanediol diglycidyl ether diacrylate and bisphenol A diglycidyl ether diacrylate, are also preferably used. It is also possible to use mixtures of the hydroxyacrylates.

The novel urethane acrylate compounds contain secondary or tertiary amino groups which are bonded to isocyanate via hydroxyl groups and are obtainable by an addition reaction of primary or secondary amines with hydroxyacrylates. Primary or secondary amino groups react with hydroxyacrylates in a reaction similar to a Michael reaction, as follows:

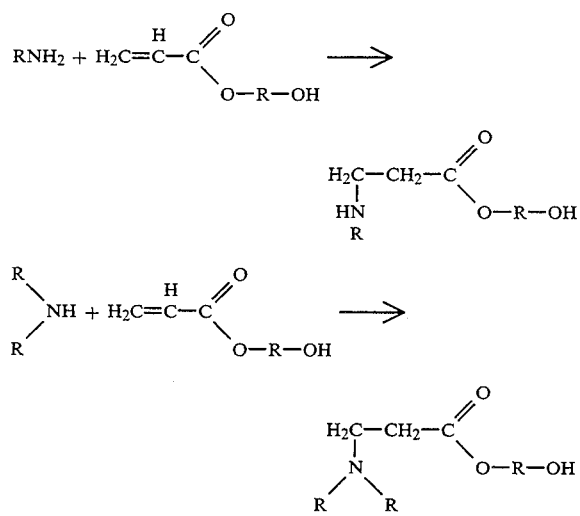

The novel urethane acrylate compounds contain preferably from 0.01 to 0.60, particularly preferably from 0.1 to 0.3, of the secondary or tertiary amino group which is obtainable in this manner and is bonded to isocyanate via the hydroxyl group of the hydroxyacrylate used and preferably from 0.01 to 0.30, particularly preferably from 0.05 to 0.20, urea group per mole of isocyanate groups of the di- or polyisocyanates used for the preparation of the urethane acrylate compounds.

Examples of suitable primary or secondary amines which undergo an addition reaction with hydroxyacrylates in a reaction similar to a Michael reaction are heterocyclic compounds, such as piperazine, 1-ethylpiperazine, N-(aminoethyl)-imidazole, morpholine and N-(aminoethyl)morpholine, and primary or secondary amines which are substituted by aliphatic and/or aromatic groups. Aliphatic primary or secondary amines which are substituted by one or two $C_1$-$C_6$-alkyl groups or $C_1$-$C_6$-hydroxyalkyl groups are preferred. Primary or secondary amines which are substituted by one or two $C_1$-$C_4$-alkyl groups are particularly preferred. Dibutylamine and morpholine are very particularly preferred. The stated primary and secondary amines lead to urea groups when reacted directly with isocyanate groups. The urea groups in the novel urethane acrylate preferably contain the same amino groups as those present in the Michael adduct obtained from hydroxyacrylate and amine. The statements made above apply to the preferred and particularly preferred choice of amino groups.

In the novel process for the preparation of radiation-curable urethane acrylate compounds containing amine and urea groups by reacting a di- or polyisocyanate with a hydroxy compound in a first step and then reacting the reaction product with a primary or secondary amine in a second step, a) in the first step isocyanate groups and hydroxyl groups are reacted in a molar ratio of from 1:0.55 to 1:0.99 and not less than 20 mol % of the hydroxyl-containing compounds are hydroxyacrylates, and b) in the second step the primary or secondary amine is used in a molar excess, based on the isocyanate groups still present after the first step, and the molar excess is smaller than the molar amount of the hydroxyacrylates used in the first step.

In the first step a), preferably from 0.70 to 0.99, particularly preferably from 0.8 to 0.95, mole of hydroxyl groups is used per mole of isocyanate groups. Not less than 20, preferably not less than 50, particularly preferably not less than 70, mol % of the hydroxy compounds used in the first step a) are hydroxyacrylates.

Preferably, particularly preferably and very particularly preferably used hydroxyacrylates and di- or polyisocyanates are indicated in the above lists of di- or polyisocyanates and hydroxyacrylates which are preferably, particularly preferably and very particularly preferably present in the urethane acrylate compounds.

The reaction of the di- or polyisocyanate compounds with the hydroxy compounds is carried out by processes which are known per se and are described in the literature.

The reaction temperature for the reaction of the di- or polyisocyanates with the hydroxy compounds may be preferably from 0° to 100° C., in particular from 20° to 70° C.

To accelerate the reaction, catalysts as described in, for example, Houben Weyl, Methoden der organischen Chemie, Vol. XIV/2, page 60 et seq., Georg Thieme-Verlag, Stuttgart (1963), or Ullmann, Encyclopädie der technischen Chemie, Vol. 19, page 306 (1981), may be used. Tin-containing compounds, such as dibutyltin dilaurate, tin(II) octoate or dibutyltin dimethoxide, are preferred.

In general, such catalysts are used in an amount of from 0.001 to 2.5, preferably from 0.005 to 1.5, % by weight, based on the total amount of the reactants.

To stabilize the compounds which can be subjected to free radical polymerization, preferably from 0.001 to 2, in particular from 0.005 to 1.0, % by weight of polymerization inhibitors are added. These are the conventional compounds used for preventing free radical polymerization, for example those of the hydroquinone, hydroquinone monoalkyl ether, 2,6-di-tert-butylphenol, N-nitrosamine, phenothiazine or phosphorous ester type.

The reaction can be carried out in the absence of a solvent or with the addition of solvents. Suitable solvents are both inert solvents and monomers which copolymerize with the urethane acrylate in the photopolymerization.

The inert solvents used are, for example, acetone, tetrahydrofuran, dichloromethane, toluene, etc., methyl ethyl ketone, ethyl acetate and butyl acetate being preferably used.

For example, acrylates, methacrylates of olefinically unsaturated aromatics, etc. can be used as monomers. Low-viscosity acrylate compounds having little odor, such as hexanediol triacrylate, trimethylolpropane triacrylate and acrylates as formed in the reaction of acrylic acid with tripropylene glycol, glycerol, pentaerythritol and trimethylolpropane, are preferred. Acrylates and acrylate mixtures of a trimethylolpropane reacted with from 2 to 10 times the molar amount of ethylene oxide, propylene oxide or a mixture of both epoxides are also preferred.

The reaction conditions are maintained until it has been ensured that all hydroxy compounds used have reacted with the isocyanate groups and the reaction solution is free of hydroxy compounds.

Only then is a primary or secondary amine or a mixture of these amines added, in process step b), to the compounds formed in process step a), the amines being used in molar excess, based on the isocyanate groups still present after process step a), and the molar excess of the amines being lower than the molar amount of the hydroxyacrylates used in step a). The use of the amines in excess, based on the isocyanate groups still present after process step a), results in a rapid and complete reaction of these isocyanate groups to give urea groups. The polyurethane formed is thus free of terminal isocyanate groups, resulting in a long shelf life. The excess primary and secondary amines are present in less than the stoichiometric amount, based on the hydroxyacrylate groups present in the polyurethane. The primary and secondary amines undergo an addition reaction with the hydroxyacrylate groups in the form of a Michael addition, aminopropyl ester groups being formed from acrylate groups. The reaction of the primary and secondary amines with acrylates is known per se and is described in text books of organic chemistry. As a result of using less than the stoichiometric amount, based on the hydroxyacrylates used in process step a), of the primary or secondary amines, all primary or secondary amines are therefore finally bonded to the polyurethane and no free amines are present in the reaction solution. Emissions of amines from the polyacrylate or its solution as used for coatings therefore do not occur. The amines bonded in this manner result in a substantial increase in the reactivity of the urethane acrylate compounds.

Amines which are preferably or particularly preferably used in process step b) are indicated in the above list of amines preferably present in the urethane acrylate compounds. Preferably from 0.02 to 0.9, particularly preferably from 0.15 to 0.50 mol %, based on the isocyanate groups present before process step a) has been carried out, is used in process step b).

The resulting radiation-curable urethane acrylate compounds can be used in radiation-curable materials and coatings. For processing, further radiation-curable resins and reactive diluents, ie. monomers capable of free radical polymerization, are generally added to the urethane acrylate compounds or to the resulting solution of urethane acrylate compounds. The urethane acrylate compounds can also be emulsified in water using emulsifiers. Assistants, such as pigments, fillers, leveling agents and stabilizers may be added. Photoinitiators are added, during use, to the urethane acrylate compounds prepared according to the invention or to solutions or mixtures thereof, which may contain further radiation-curable resins and monomers, so that, after application of the coatings to the corresponding surfaces, curing can be effected by UV radiation or electron beams.

EXAMPLE 1

0.2 g of dibutyltin dilaurate, 1.0 g of 2,6-di-tert-butyl-p-cresol and 0.51 g of hydroquinone monomethyl ether were added to 571.8 g of the isocyanurate compound of hexamethylene diisocyanate (Basonat® P LR 8638, BASF AG) while stirring, and the mixture was heated to 55° C. 396.7 g (2.75 moles) of butanediol monoacrylate were then metered in over 89 minutes, the temperature increasing to 70° C. After the reaction had continued for 4 hours at 70° C., the isocyanate content was 0.165 mole of NCO. 94.9 g (0.735 mole) of dibutylamine were then added in the course of 12 minutes, the temperature increasing to 73° C. After a further 2.5 hours, the mixture was diluted to 4.96 Pa.s with 424 parts of dipropylene glycol diacrylate (23° C., ICI cone-and-plate viscometer).

In order to obtain a processing viscosity of 500 mPa.s, 100 g of the resulting mixture were further diluted with butyl acetate, and 4 g of benzil dimethyl ketal (Lucirin® BDK, BASF) were added as a photoinitiator. A layer was applied as a 15 μm thick wet film to KD paper, the solvent was evaporated in the air and, to determine the reactivity, the said layer was passed, at a distance of 10 cm, in the air, below an 80 W/cm medium pressure mercury lamp by means of a conveyor belt. At a belt speed of 50 m/min, a scratch-resistant coating was obtained. A 100 μm layer obtained in a corresponding manner at 50 m/min was likewise scratch-resistant. A 200 μm layer on glass, exposed twice at a belt speed of 10 m/min in each case, had a pendulum damping value of 42 sec (DIN 53,157). A 50 μm layer on BONDER sheet 132, exposed in the same manner, achieved an Erichsen cupping value of 6.2 mm (DIN 53,156). The resistances to chemicals (DIN 68,860B) were very good.

The amine number of the urethane acrylate compound was 30.4 mg KOH/g. These are amines which have undergone addition with hydroxyacrylate in a reaction similar to a Michael reaction and are thus bonded to the urethane acrylate via the hydroxyl group of the acrylate.

EXAMPLE 2

0.18 g of dibutyltin dilaurate, 0.9 g of 2,6-di-tert-butyl-p-cresol and 0.45 g of hydroquinone monomethyl ether were added to 508.7 g of the isocyanurate compound of toluylene diisocyanate (Basonat® P LR 8528, BASF AG) while stirring. 292.3 g (2.03 moles) of butanediol monoacrylate were then metered in over 52 minutes, the temperature increasing to 70° C. After the reaction had continued for 6 hours at 70° C. the isocyanate content was 0.067 mole. 99.3 g (0.77 mole) of dibutylamine were then added in the course of 31 minutes, the temperature increasing to 75° C. After a further 2 hours, the mixture was diluted to 241 Pa.s with 360.7 g of dipropylene glycol diacrylate (23° C., ICI cone-and-plate viscometer).

In order to obtain a processing viscosity of 500 mPa.s, 100 g of the resulting mixture were further diluted with butyl acetate, and 4 g of benzil dimethyl ketal (Lucirin® BDK, BASF) were added as a photoinitiator. A layer was applied as a 15 μm thick wet film to KD paper, the solvent was evaporated in the air and, to determine the reactivity, the said layer was passed, at a distance of 10 cm, in the air, below an 80 W/cm medium pressure mercury lamp by means of a conveyor belt. At a belt speed of 55 m/min, a scratch-resistant coating was obtained. A 100 μm layer obtained in a corresponding manner at 60 m/min was scratch-resistant. A 200 μm layer on glass, exposed twice at a belt speed of 10 m/min in each case, had a pendulum damping value of 55 sec (DIN 53,157). A 50 μm layer on BONDER sheet 132, exposed in the same manner, achieved an Erichsen cupping value of 7.2 mm (DIN 53,156). The resistances to chemicals (DIN 68,860B) were excellent. The amine number of the urethane acrylate was 45.5.

COMPARATIVE EXAMPLE

In contrast to the Examples, equivalent amounts of hydroxyalkyl acrylate and amine were added to the isocyanate.

0.2 g of dibutyltin dilaurate, 1.0 g of 2,6-di-tert-butyl-p-cresol and 0.51 g of hydroquinone monomethyl ether were added to 601.9 g of the isocyanurate compound of hexamethylene diisocyanate while stirring, and the mixture was heated to 55° C. 326.6 g (2.27 moles) of butanediol monoacrylate were then metered in over 50 minutes, the temperature increasing to 70° C. After the reaction had continued for 2 hours at 70° C., the isocyanate content was 0.78 mole of NCO. 101.3 g (0.78 mole) of dibutylamine were then added in the course of 50 minutes, the temperature increasing to 73° C. After a further 2.5 hours, the mixture was diluted to 7.8 Pa.s with 412.6 g of dipropylene glycol diacrylate (23° C., ICI cone-and-plate viscometer). The amine number of the urethane acrylate was 0.1.

After adjustment to the processing viscosity and the addition of 4 g of benzil dimethyl ketal, the reactivities, the pendulum damping value and the Erichsen cupping value were determined similarly to the Examples.

Reactivities of only 10 m/min were achieved for the 15 μm and 100 μm layers. The pendulum damping value was 70 sec and the Erichsen cupping value was 5.6 mm. The resistance to chemicals is comparable with that of Example 1.

The experiments show that when an amine compound is used in excess, based on the number of isocyanate equivalents still present after reaction with the hydroxyacrylate, substantially improved properties are achieved. Under the experimental conditions, the excess amine is not present as a free compound but is bonded to the hydroxyacrylates reacted with isocyanate.

We claim:

1. A radiation-curable urethane acrylate compound containing amine and urea groups and based on di- or polyisocyanates, hydroxy compounds and amines, which contains secondary or tertiary amino groups which are bonded to isocyanate via hydroxyl groups and are obtained by an addition reaction of primary or secondary amines with hydroxyacrylates.

2. A urethane acrylate compound as defined in claim 1, containing from 0.01 to 0.6 mole of the stated secondary or tertiary amino groups and from 0.01 to 0.30 mole of urea groups per mole of isocyanate groups of the di- or polyisocyanates used for the preparation of the urethane acrylate compound.

3. A urethane acrylate compound as defined in claim 1, containing a reaction product of a trihydric or polyhydric alcohol with one or more diisocyanate compounds in a ratio of the number of equivalents of OH to that of NCO of from 1:1.5 to 1:2.5, as a polyisocyanate.

4. A urethane acrylate compound as defined in claim 1, containing an isocyanurate as the polyisocyanate.

5. A process for the preparation of a radiation-curable urethane acrylate compound containing amine and urea groups by reacting a di- or polyisocyanate with hydroxy compounds in a first step and then reacting the reaction product with a primary or secondary amine in a second step, wherein
   a) in the first step isocyanate groups and hydroxyl groups are reacted in a molar ratio of from 1:0.55 to 1:0.99 and not less than 20 mol % of the hydroxyl-containing compounds are hydroxyacrylates, and
   b) in the second step the primary or secondary amine is used in a molar excess, based on the isocyanate groups still present after the first step, and the molar excess is smaller than the molar amount of the hydroxyacrylates used in the first step.

6. A radiation-curable urethane acrylate compound containing amine and urea groups obtained in a two-step process by reacting a di- or polyisocyanate with hydroxy compounds in a first step and then reacting the reaction product with a primary or secondary amine in a second step, wherein
   a) in the first step isocyanate groups and hydroxyl groups are reacted in a molar ratio of from 1:0.55 to 1:0.99 and not less than 20 mol % of the hydroxyl-containing compounds are hydroxyacrylates, and
   b) in the second step the primary or secondary amine is used in a molar excess, based on the isocyanate groups still present after the first step, and the molar excess is smaller than the molar amount of the hydroxyacrylates used in the first step.

* * * * *